United States Patent [19]

Matsumoto

[11] Patent Number: 4,816,889

[45] Date of Patent: Mar. 28, 1989

[54] PHOTOELECTRIC CONVERSION DEVICE

[75] Inventor: Shigeyuki Matsumoto, Atsugi, Japan

[73] Assignee: Canon Kabushiki Kaisha, Tokyo, Japan

[21] Appl. No.: 870,420

[22] Filed: Jun. 4, 1986

[30] Foreign Application Priority Data

Jun. 12, 1985 [JP]   Japan ................... 60-126285

[51] Int. Cl.$^4$ ............... H01L 27/14; H01L 29/78
[52] U.S. Cl. ........................ 357/30; 357/34; 357/43; 357/23.1; 357/40
[58] Field of Search ............... 357/30 D, 30 G, 30 H, 357/30 P, 30 Q, 34, 35, 23.6, 23.1, 43, 45, 47, 40, 50, 51

[56] References Cited

U.S. PATENT DOCUMENTS 4,686,554  8/1987  Ohmi et al. ..................... 357/40

FOREIGN PATENT DOCUMENTS 132076  1/1985  European Pat. Off. .

Primary Examiner—William L. Sikes
Assistant Examiner—Georgia Y. Epps
Attorney, Agent, or Firm—Fitzpatrick, Cella, Harper & Scinto

[57] ABSTRACT

A photoelectric conversion device has a plurality of photoelectric conversion cells, each cell having a semiconductor transistor comprising two main electrode regions made of one conductivity type semiconductor and a control electrode region made of opposite conductivity type semiconductor, and a capacitor for controlling a potential of the control electrode region in a floating state, the potential at the control electrode region in a floating state being controlled by means of the capacitor so that carriers generated by light are stored in the control electrode region and the output of each cell is controlled in accordance with the storage voltage generated by the storage. In such a photoelectric conversion device, a plurality of points on the control electrode region constituting a light reception region for the photoelectric conversion cell or on the main electrode region, are short-circuited by interconnections.

4 Claims, 5 Drawing Sheets

PHOTOELECTRIC CONVERSION DEVICE

BACKGROUND OF THE INVENTION

1. Field of the Invention

The present invention relates to a photoelectric conversion device having a charge storage region whose potential can be controlled by means of a capacitor.

2. Related Background Art

FIG. 1A is a schematic plan view showing a photoelectric conversion device described in the Official Gazette of an EPC laid-open publication No. 0132076, and FIG. 1B is a cross section along line I—I of FIG. 1A.

In the figures, photosensor cells are formed disposed on an n+ silicon substrate 101, each photosensor cell being electrically insulated from adjacent cells by an element isolation region 102 made of, such as $SiO_2$, $Si_3N_4$, or polysilicon.

Each photosensor cell is constructed as in the following:

On an n− region 103 of low impurity density which is formed by epitaxial technique or the like, there is formed a p region 104 by doping p-type impurities within which p region an n+ region 105 is formed by impurity diffusion technique or ion implantation technique. The p region 104 and n+ region 105 constitute the base and emitter of a bipolar transistor, respectively.

On the p region 104 and n+ region 105 formed on the n− region 103, there is formed an oxidized film 106 on which a capacitor electrode 107 having a predetermined area is formed. The capacitor electrode 107 faces the p region 104, the oxidized film 106 being interposed therebetween. Thus, by applying a voltage pulse to the capacitor electrode 107, the potential of the p region 104 at a floating state can be controlled.

In addition, there are formed an emitter electrode 108 connected to the n+ region 105, an interconnection 109 for reading a signal from the emitter electrode and outputting it to an external circuit, an interconnection 110 connected to the capacitor electrode 107, an n+ region 111 of high impurity density on the back of the substrate 101, and an electrode 112 for applying a potential to the collector of the bipolar transistor.

Next, the fundamental operation of the above-described photosensor will be described. Assume that the p region 104 or base of the bipolar transistor is at an initial state biased to a negative potential. Light 113 is applied to the p region 104 or the base of the the bipolar transistor to store the charge corresponding to light quantity in the p region 104 (storage operation). The base potential varies with the stored charge so that current flowing through the emitter and collector is controlled. By reading a potential change from the emitter electrode at a floating state, an electrical signal corresponding to the incident light quantity can be obtained (readout operation). To eliminate the stored charge in the p region 104, the emitter electrode 108 is grounded and the capacitor electrode 107 is applied with a positive pulse voltage. Since the p region 104 is forward-biased relative to the n+ region 105 by applying the positive pulse voltage, the stored charge is eliminated. As the positive pulse voltage or refreshing pulse falls, the p region 104 resumes the initial state biased to a negative potential (refreshing operation). The above operations, i.e., storage, readout and refreshment are repeated.

In summary, the charge generated by incident light is stored in the p region 104 or base so that current flowing through the emitter electrode 108 and collector electrode 112 can be controlled. Thus, the stored charge is amplified at each cell and thereafter is read so that a high output and sensitivity as well as a low noise can be achieved.

The base potential $V_p$ generated by the holes stored in the base through light excitation is given by Q/C, wherein Q represents the charge quantity of holes stored in the base, and C represents a capacitance connected to the base. As apparent from the above relationship, a high integration of the photosensor leads to a reduction in cell size as well as a reduction in values of Q and C, so that the potential $V_p$ generated through light excitation is maintained substantially constant. Consequently, this method is considered also effective for future high resolution photosensors.

However, it is necessary to dispose narrow and elongated photosensor arrays in a photoelectric conversion device if high integration and resolution are intended without lowering an output voltage. In this case, resistance in the longitudinal direction of the array becomes large so that a potential distribution is generated in the active region of a photosensor cell, resulting in a reduction in response speed and the occurrence of an afterimage phenomenon.

SUMMARY OF THE INVENTION

An object of the present invention is to provide a photoelectric conversion device with a remarkably improved performance as compared with a conventional one.

Another object of the present invention is to provide a photoelectric conversion device having a structure suitable for high resolution and high integration.

A further object of the present invention is to provide a photoelectric conversion device having a plurality of photoelectric conversion cells, each cell having a semiconductor transistor comprising two main electrode regions made of one conductivity type semiconductor and a control electrode region made of another conductivity type semiconductor, and a capacitor for controlling potential of said control electrode region in a floating state, the potential at said control electrode region in a floating state being controlled by means of said capacitor so that carriers generated by light are stored in said control electrode region and the output of each cell is controlled in accordance with the storage voltage generated by said storage; wherein a plurality of points on said control electrode region constituting a light reception region for said photoelectric conversion cell or on said main electrode region, are short-circuited by interconnections.

DETAILED DESCRIPTION OF THE PREFERRED EMBODIMENT

The embodiment of the present invention will now be described in detail with reference to the accompanying drawings.

Figure 1A:
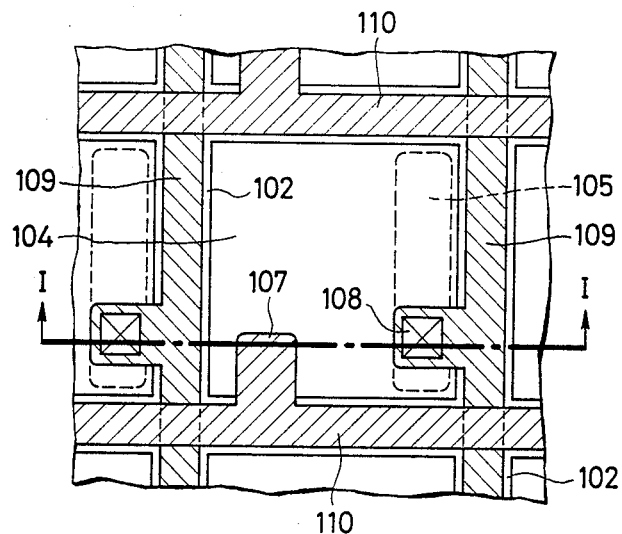
FIG. 1A is a schematic plan view illustrating a conventional photoelectric conversion device.
Figure 1B:
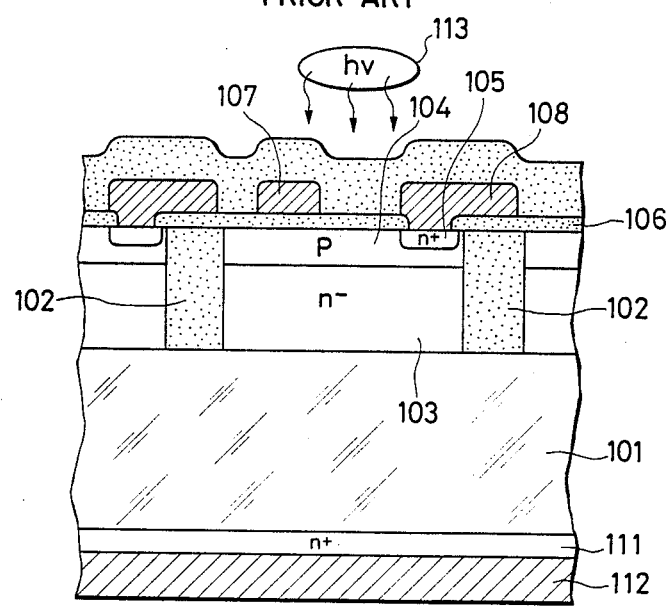
FIG. 1B is a cross section along line I—I of FIG. 1A.
Figure 2A:
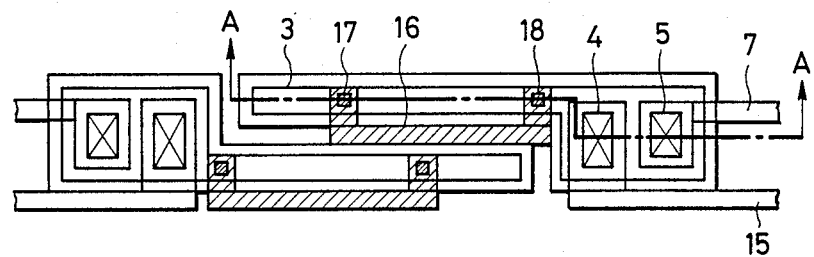
FIG. 2A is a plan view showing an embodiment of a photoelectric conversion device according to the present invention.
Figure 2B:
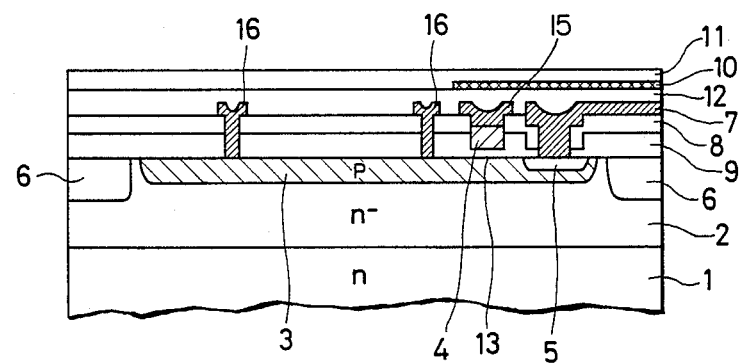
FIG. 2B is a cross section along line A—A of FIG. 2A.

FIG. 2A is a schematic plan view showing an embodiment of the photoelectric conversion device according to the present invention, and FIG. 2B is a cross section along line A—A of FIG. 2A.

Referring to the figures, on an n-type silicon substrate 1, there is formed an n⁻ epitaxial layer 2 within which photosensor cells are disposed each electrically insulated by element isolation regions 6.

In this example, the element isolation region 6 was formed by impurity diffusion technique, but the invention is not limited thereto. The element isolation region 6 may be formed instead by means of known technique, such as LOCOS method, impurity diffusion through an oxidized film formed by the LOCOS method, trench method (Bulk Etch) or the like.

Each photosensor cell comprises: a p base region 3 and an n+ emitter region 5 of a bipolar transistor formed within the n⁻ epitaxial region 2; a polysilicon 4 of a capacitor electrode for applying a pulse to the p base region 3 via an oxidized film 13 interposed therebetween; an electrode 7 connected to the n+ emitter region 5; an electrode 15 connected to the polysilicon 4; and an unrepresented collector electrode at the back of the substrate 1 for applying a potential to the collector of the bipolar transistor.

The electrode region defined by the polysilicon 4 of the capacitor electrode 7 and the emitter electrode, is covered with a light shielding layer 10. The region narrower than the electrode region, defined by the base region 3 and the n⁻ epitaxial layer 2, is a light receiving region.

A plurality of contact holes 17 and 18 are formed on the base region 3. Interconnections 16 are connected at the contact holes to short-circuit the elongated base region 3. Therefore, the internal resistance of the elongated base region 3 is reduced to accordingly prevent generating a potential distribution in the base region. In this case, the interconnections 16 are disposed above the element isolation region 6 so that the photoelectric conversion efficiency of the cells is not degraded.

According to the fundamental operation of this embodiment, the p base region 3 at an initial state biased to a negative potential is first made into a floating state as described previously, and holes among pairs of electrons and holes generated by light excitation are stored in the p base region 3 (storage operation). Succeedingly, the emitter and base are forward-biased to control the emitter-collector current by the storage voltage generated by the stored holes and read from the emitter at a floating state a voltage corresponding to the storage voltage (readout operation). Then, by grounding the emitter and applying a positive pulse voltage to the polysilicon 4 of the capacitor electrode, the stored holes in the p base region 3 are eliminated via the emitter (refreshing operation). By eliminating the stored holes, the p base region 3 resumes an initial state biased to a negative potential when the refreshing positive pulse voltage falls.

The photosensor cells constructed as above has a remarkably improved high density of light receiving region, because as shown in FIG. 2A the electrode region having a low photoelectric conversion efficiency is shielded by the light shielding layer 10, while the light receiving regions narrower than the electrode region and having a high photoelectric conversion efficiency are alternately disposed between the electrode regions.

Next, the manufacturing processes of this embodiment will be described.

FIGS. 3A to 3H illustrate the manufacturing processes of this embodiment.

Figure 3A:
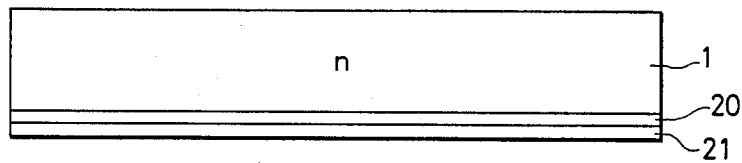
FIGS. 3A to 3H are views illustrating the manufacturing processes of the photoelectric conversion device of the embodiment.

First, as shown in FIG. 3A, at the back of an n type silicon substrate 1 having an impurity density of $1 \times 10^{15}$ to $5 \times 10^{18}$ cm$^{-3}$, an n+ layer 20 for ohmic contact having an impurity density of $1 \times 10^{17}$ to $1 \times 10^{20}$ cm$^{-3}$ is formed by diffusing P, As or Sb. Next, on the n+ layer 20 an oxidized film 21 (e.g., SiO$_2$ film) having a thickness of 3000 to 7000 Å is formed by means of a CVD method.

The oxidized film 21, which is called a back coat, is used for preventing impurity vapor from being generated during a heat treatment process of the substrate 1.

Figure 3B:
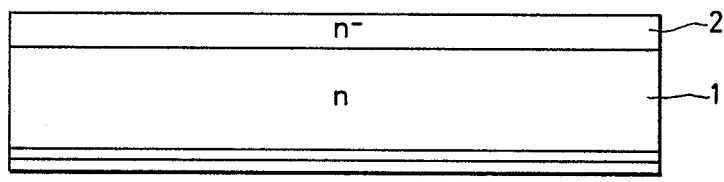

Next, the surface of the substrate 1 is etched for about 1.5 minute under the condition of temperature at 1000° C., 2 l/min of HC and 60 l/min of H$_2$. Thereafter, an n⁻ epitaxial layer 2 (hereinafter referred to as n⁻ layer 2) is formed under the condition of, for example, 1.2 l/min of source gas SiH$_2$Cl$_2$ (100%), 100 cc flow of doping gas (20 PPM PH$_3$ diluted by H$_2$), growing temperature of 100° C. and reduced pressure at 120 to 180 torr. The monocrystal growing rate is 0.5 μm/min, the thickness of the monocrystal is 2 to 10 μm. The impurity density is $1 \times 10^{12}$ to $10^{16}$ cm$^{-3}$, or preferably $10^{12}$ to $10^{14}$ cm$^{-3}$ (FIG. 3B).

Next, on the n⁻ layer 2 a pad oxidized film 22 of 500 to 1500 Å thickness is formed by means of pyrogenec oxidation (H$_2$+O$_2$), wet oxidation (O$_2$+H$_2$O), steam oxidation (N$_2$+H$_2$O) or dry oxidation. To obtain a good oxidized film without lamination defects, a high pressure oxidation at temperature of 800° to 1000° C. is preferable.

The oxidized film 22 is provided for preventing channeling and surface defects during the process for forming a base region through ion implantation. In the above process, the back coat oxidized film 21 is completely removed.

Figure 3C:
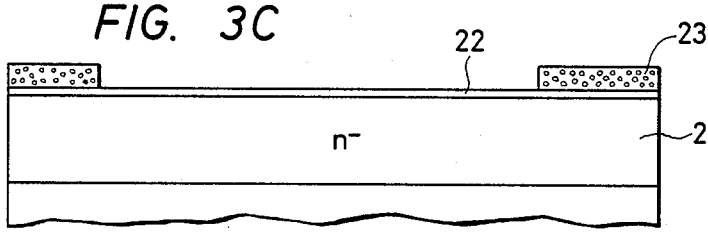

Succeedingly, a resist 23 is coated, the part of which where the base region is formed is selectively removed (FIG. 3C).

Next, B+ ions or BF$_2$+ ions produced using BF$_3$ as material gas are implanted into the wafer. The surface density thereof is $1 \times 10^{15}$ to $5 \times 10^{18}$ cm$^{-3}$, or preferably $1 \sim 20 \times 10^{16}$ cm$^{-3}$, while the doping amount of ions is $7 \times 10^{11}$ to $1 \times 10^{15}$ cm$^{-2}$, or preferably $1 \times 10^{12}$ to $1 \times 10^{14}$ cm$^{-2}$.

Figure 3D:
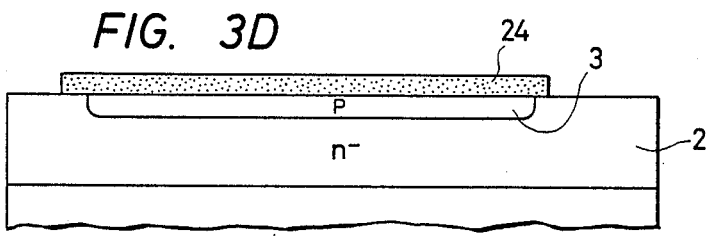

After the ion-implantation and removal of the resist 23, the p base region 3 is formed down to a predetermined depth through heat diffusion under the condition of 1100° to 1100° C. and N$_2$ atmosphere, and at the same time a thick oxidized film 24 is formed on the surface of the substrate 1. Then, the oxidized film 24 where the element isolation region 6 is formed is selectively removed (FIG. 3D).

The depth of the p base region 3 is 0.6 to 1 μm for example.

An alternative method of forming the base region 3 is to deposit BSG on the wafer and diffuse impurity B down to a predetermined depth through heat treatment at 1100° to 1200° C.

Next, to form the element isolation region 6, n+ diffusion is carried out through diffusion from POCL$_3$ or ion implantation at a preferable density of $10^{17}$ to $10^{21}$ cm$^{-3}$. Use of POCL$_3$ obtained a good result under the condition of furnace temperature at 850° to 100° C., POCL$_3$ bubble carrier gas at 50 to 200 cc/min, and process time at 10 to 40 minutes.

Figure 3E:
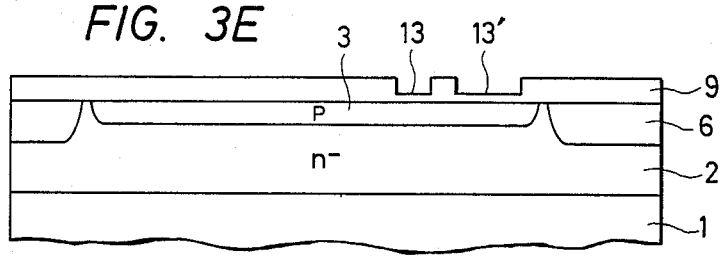

After formation of the element isolation region 6 and the base region 3, a thick oxidized film 9 is deposited on the substrate 1 through oxidation process. Next, the parts of the oxidized film 9 are selectively removed where the capacitor electrode and the emitter region are formed. In the openings thus formed, a gate oxidized film 13 and an oxidized film 13' are formed to the thickness of 100 to 1000 Å (FIG. 3E).

Thereafter, polysilicon with As doped is deposited by means of a CVD method using (N$_2$+SiH$_4$+AsH$_3$) gas or (H$_2$+SiH$_4$+AsH$_3$) gas. The deposition temperature is about 550° to 900° C. and the thickness is 2000 to 7000 Å. Obviously, it is also possible to deposit non-doped polysilicon by means of a CVD method and thereafter diffuse As or P. The deposited polysilicon film is partially etched by means of a photolithography process to form a polysilicon 4 of the capacitor electrode.

Figure 3F:
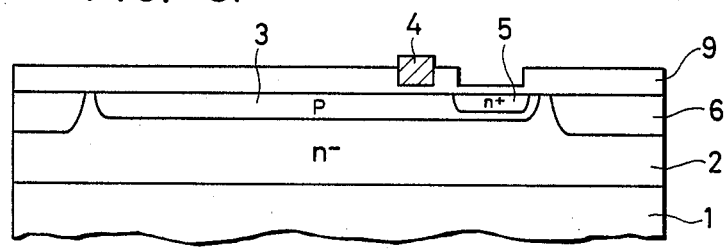

Next, impurity ions such as P or As are ion-implanted through the oxidized film 13' into the area where an emitter region is formed. After heat treatment, an n+ region 5 is formed (FIG. 3F).

In this embodiment although the n+ emitter region is formed by means of an ion implantation method, the emitter region 5 may be formed in such a way that the oxidized film 7' is removed, in the opening thus obtained, polysilicon is deposited at the process forming the polysilicon 4, and impurity such as P or As in the polysilicon is diffused into the p base region 3 through heat treatment to form the n+ emitter region 5

Figure 3G:
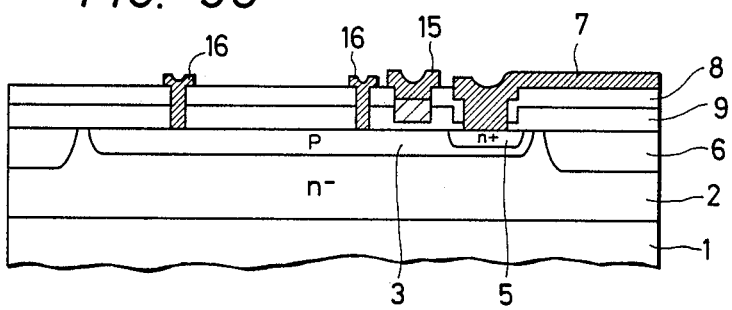
Figure 3H:
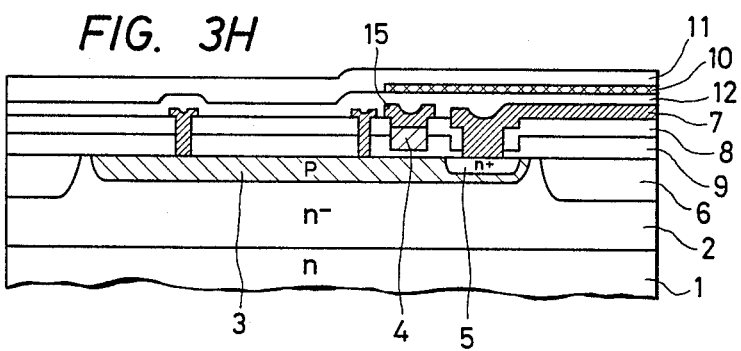

Next, a PSG film or SiO$_2$ film 8 is deposited by means of a CVD method using the above-described gas to the thickness of 3000 to 7000 Å. Succeedingly, contact holes are formed on the polysilicon 4, the emitter region 5 and the base region 3 by mask alignment and etching process. Electrodes 7 and 15 and interconnections 16 (metal such as Al, Al-Si, Al-Cu-Si) are deposited in the contact holes by means of a vacuum evaporation or sputtering method (FIG. 3G).

Succeedingly, an interlayer insulation film 12 such as PSG film or SiO$_2$ film is deposited to the thickness of 3000 to 9000 Å by means of a CVD method. In addition, the light shielding layer (e.g., Al and so on) is deposited to the thickness of 2800 to 5000 Å, and the part of the layer where the light receiving region is formed is removed through etching.

Figure 4A:
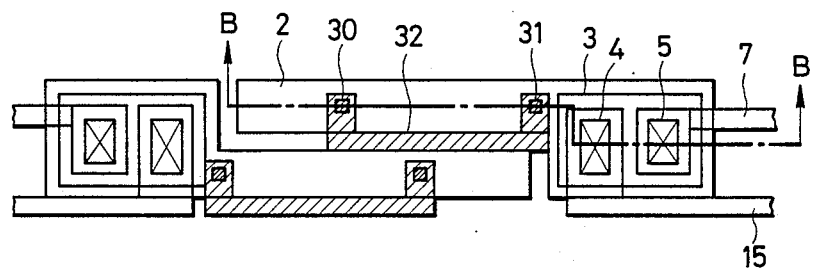
FIG. 4A is a plan view showing another embodiment of the present invention.
Figure 4B:
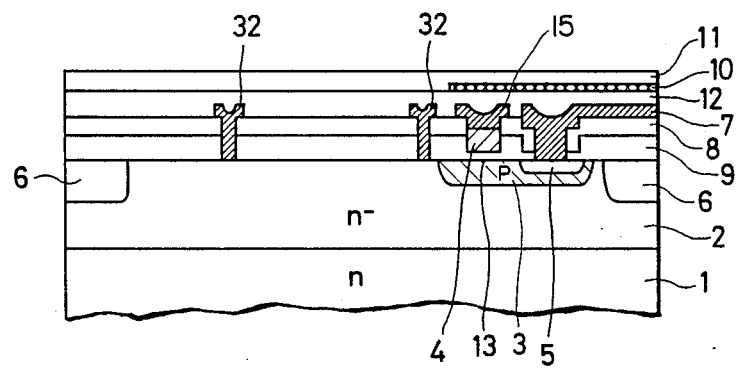
FIG. 4B is a cross section along line B—B of FIG. 4A.

Lastly, a passivation film 11 (such as PSG film or Si$_3$N$_4$ film) is formed by means of a CVD method and thereafter, an unrepresented collector electrode (metal such as Al, Al-Si, Au) is formed at the back of the wafer. Thus, a photoelectric conversion device as shown in FIGS. 2A and 2B can be manufactured FIG. 4A is a plan view showing another embodiment of the present invention, and FIG. 4B is a cross section along line B—B of FIG. 4A.

In the figures, the base region 3 is formed underneath the electrode region, while the light receiving region is constructed of only the n$^-$ epitaxial layer 2. Also in this case, a plurality of contact holes 30 and 31 are formed on the n+ epitaxial layer 2, and interconnections 32 such as metal are provided on the element isolation region 6. Therefore, the internal resistance of the n$^-$ epitaxial layer 2 can be reduced.

In the above embodiments, although an elongated and continuous base region or an n$^-$ epitaxial layer is made short-circuited using interconnections, the invention is not intended to be limited thereto. For instance, in case where an n+ epitaxial layer is divided into plural portions and a plurality of light receiving regions are formed in a single photosensor cell, respective n$^-$ epitaxial layer portions are short-circuited to reduce the internal resistance.

As seen from the foregoing detailed description of the photoelectric conversion device of the present invention, since a plurality of points on the region constituting the light receiving region are short-circuited by interconnections, the internal resistance is greatly reduced so that a high speed operation is possible and the afterimage phenomenon can be avoided. Further, miniaturization of the device is possible without deteriorating the photoelectric conversion characteristics.

What is claimed is:

1. A photoelectric converter for providing an output signal which varies as a function of light energy received thereby, said converter having a transistor comprising:
    two main semiconductor regions made of a first conductivity type material;
    a control semiconductor region made of a conductivity type material opposite to the first conductivity type and adapted for accumulation of carriers responsive to the received light energy;
    an elongated light receiving portion formed from at least one of said control region and one of said main regions;
    first and second connecting portions electrically connected to said light receiving portion; and
    a wiring electrode for electrically shorting said first connecting portion to said second connecting portion.

2. A photoelectric converter according to claim 1, having a plurality of said transistors respectively isolated by element isolation regions.

3. A photoelectric converter according to claim 2, wherein said wiring electrode is provided on said element isolation regions.

4. A photoelectric converter according to claim 1, further having a capacitor comprising said control region, an electrically insulating layer formed on said control region, and an electrode formed on said insulating layer.

* * * * *